(12) United States Patent
Dudin et al.

(10) Patent No.: US 11,885,315 B2
(45) Date of Patent: Jan. 30, 2024

(54) RADIO-FREQUENCY PLASMA GENERATING SYSTEM AND METHOD FOR ADJUSTING THE SAME

(71) Applicant: THRUSTME, Paris (FR)

(72) Inventors: Stanislav Dudin, Kharkov (UA); Dmytro Rafalskyi, Orsay (FR)

(73) Assignee: THRUSTME, Paris (FR)

( * ) Notice: Subject to any disclaimer, the term of this patent is extended or adjusted under 35 U.S.C. 154(b) by 105 days.

(21) Appl. No.: 17/620,455

(22) PCT Filed: Jun. 17, 2020

(86) PCT No.: PCT/EP2020/066793
§ 371 (c)(1),
(2) Date: Dec. 17, 2021

(87) PCT Pub. No.: WO2020/254425
PCT Pub. Date: Dec. 24, 2020

(65) Prior Publication Data
US 2022/0341405 A1    Oct. 27, 2022

(30) Foreign Application Priority Data

Jun. 18, 2019  (EP) .................... 19305781

(51) Int. Cl.
*F03H 1/00* (2006.01)
*H05H 1/46* (2006.01)
*B64G 1/40* (2006.01)

(52) U.S. Cl.
CPC .......... *F03H 1/0081* (2013.01); *H05H 1/466* (2021.05); *H05H 1/4652* (2021.05); *B64G 1/405* (2013.01); *H05H 2242/20* (2021.05)

(58) Field of Classification Search
CPC ...... H05H 1/46; H05H 1/466; H05H 2242/20; H05H 1/36; H01J 37/32183;
(Continued)

(56) References Cited

U.S. PATENT DOCUMENTS 5,383,019 A * 1/1995 Farrell .................... G01N 21/73
                                                      250/288
5,495,107 A * 2/1996 Hu ......................... H01J 49/105
                                                      250/281

(Continued)

OTHER PUBLICATIONS

International Search Report for PCT/EP2020/066793 dated Sep. 14, 2020, 3 pages.
(Continued)

*Primary Examiner* — Craig Kim
(74) *Attorney, Agent, or Firm* — NIXON & VANDERHYE

(57) ABSTRACT

Disclosed is a radio-frequency plasma generating system including a radio-frequency generator and a plasma source, the radio-frequency generator being inductively or capacitively coupled to the plasma source through a resonant electric circuit, the radio-frequency generator being adapted to receive direct current power from a direct current power supply and for generating radio-frequency power at a frequency f, the radio-frequency power including a reactive radio-frequency power oscillating in the resonant electric circuit and an active radio-frequency power absorbed by the plasma. The radio-frequency plasma generating system includes a unit for measuring an efficiency of conversion E of direct-current power to active radio-frequency power absorbed by the plasma and a unit for adjusting the frequency f as a function of the measured efficiency of conversion E to maintain the efficiency of conversion E in a predetermined range within a RF plasma operational range.

20 Claims, 3 Drawing Sheets

(58) Field of Classification Search
CPC .............. H01J 37/32082; F03H 1/0081; F03H 1/0018; B64G 1/405
See application file for complete search history.

(56) References Cited

U.S. PATENT DOCUMENTS

| | | | | |
|---|---|---|---|---|
| 5,506,677 A * | 4/1996 | Eisentraut | ............... | G01N 21/71 356/243.2 |
| 5,543,689 A * | 8/1996 | Ohta | ................... | H01J 37/3299 315/111.41 |
| 6,122,050 A * | 9/2000 | Rutzke | .................... | G01J 3/443 356/316 |
| 6,740,842 B2 * | 5/2004 | Johnson | ................... | H05H 1/46 156/345.45 |
| 6,741,944 B1 * | 5/2004 | Verdeyen | ............ | H01J 37/3299 702/108 |
| 6,790,487 B2 * | 9/2004 | Johnson | ............ | H01J 37/32165 427/595 |
| 6,887,339 B1 * | 5/2005 | Goodman | ......... | H01J 37/32082 156/345.47 |
| 8,294,370 B2 * | 10/2012 | Kadrnoschka | ........ | F03H 1/0018 315/111.41 |
| 11,166,352 B2 * | 11/2021 | Scott | ....................... | A23L 3/365 |
| 11,382,190 B2 * | 7/2022 | Piel | ........................ | H05B 6/647 |
| 11,398,369 B2 * | 7/2022 | Wang | ................ | H01J 37/32917 |
| 11,476,091 B2 * | 10/2022 | Bhutta | .............. | H01L 21/02274 |
| 11,515,123 B2 * | 11/2022 | Van Zyl | ............. | H01J 37/32165 |
| 11,521,831 B2 * | 12/2022 | Ulrich | ...................... | H03H 7/38 |
| 11,521,833 B2 * | 12/2022 | Bhutta | .............. | H01L 21/28556 |
| 11,569,685 B2 * | 1/2023 | Partovi | ................. | G06F 1/1683 |
| 11,588,351 B2 * | 2/2023 | Danilovic | ............... | H02J 50/12 |
| 11,601,017 B2 * | 3/2023 | Partovi | ................. | H02J 7/0013 |
| 11,606,119 B2 * | 3/2023 | Partovi | ................. | H02J 7/00302 |
| 11,621,585 B2 * | 4/2023 | Karalis | ................. | B60L 53/126 307/104 |
| 11,637,458 B2 * | 4/2023 | McCauley | ............. | H01F 38/14 307/104 |
| 2004/0026231 A1 * | 2/2004 | Pribyl | .................. | H01Q 21/205 422/186.29 |
| 2004/0130916 A1 * | 7/2004 | Baarman | ........... | H02J 13/00022 363/21.02 |

OTHER PUBLICATIONS

Written Opinion of the ISA for PCT/EP2020/066793 dated Sep. 14, 2020, 6 pages.

* cited by examiner

RADIO-FREQUENCY PLASMA GENERATING SYSTEM AND METHOD FOR ADJUSTING THE SAME

CROSS-REFERENCE TO RELATED APPLICATIONS

This application is the U.S. national phase of International Application No. PCT/EP2020/066793 filed Jun. 17, 2020 which designated the U.S. and claims priority to European Patent Application No. 19305781.7 filed Jun. 18, 2019, the entire contents of each of which are hereby incorporated by reference.

BACKGROUND OF THE INVENTION

Field of the Invention

The invention relates to a radio-frequency (or RF) generator for plasma sources.

More precisely the invention relates to a device and a method for delivering radio-frequency energy to a plasma source.

Description of the Related Art

Numerous documents describe devices and methods for generating radio-frequency energy and coupling said RF energy to a plasma source through inductive and/or capacitive coupling. However, the impedance of the plasma source may change depending on plasma conditions including RF power, gas pressure and temperature among other operating parameters.

Most of these devices and methods use an impedance matching device (or matchbox) arranged between the RF generator and the plasma source. The system comprises the RF generator connected through a transmission line to the matching device and the plasma source. The transmission line is generally a standard impedance of 50 ohms. The system is generally configured to contain two resonant circuits connected through the transmission line. One of the resonant circuit includes a power transistor or several switchable transistors at the output stage of the RF generator. The second resonant circuit includes the plasma load with impedance active and reactive parts. For optimal operation of the system, two conditions must be satisfied simultaneously. The two resonant circuits must be tuned in resonance at the same frequency and the two resonant circuits must be matched to the transmission line impedance. The simultaneous fulfillment of these conditions requires two adjustable elements in each resonant circuit. Usually, the impedance matching device uses variable capacitors or a set of capacitors having discrete capacitance values. The RF generator's circuit may be tuned once, during production. However, the resonant circuit in the matchbox must be retuned after every change of the load impedance. Usually, the matching step requires mechanical adjustment of two variable capacitors or switching fixed capacitors in two groups. This adjustment is based on complex algorithm which requires measurement of amplitude and phase of the RF voltage and RF current in the circuit.

When the RF generator is coupled to a plasma source, for example an inductively-coupled plasma, the plasma is located inside the inductive coil, and its impedance is a part of the coil impedance, so any change in operating conditions such as temperature, gas pressure and/or input power, causes a change of the load impedance. Thus retuning the matchbox is required. However, retuning also relies on complex algorithm and requires some time.

U.S. Pat. No. 6,887,339 discloses an RF plasma generator including a variable frequency RF power supply with integrated matching network. This RF plasma generator uses frequency tuning and a variable impedance in the matching network to minimize power reflected by the plasma.

U.S. Pat. No. 5,383,019 discloses a RF power supply providing energy to an inductively coupled plasma spectrometer via a matching network and reflectometer. The reflectometer measures a signal indicative of reflected power which is used to adjust the frequency of the power supply to the resonant frequency of the matching network and plasma induction coil, in order to maximize power transfer.

U.S. Pat. No. 8,294,370 discloses a high frequency generator for ion and electron sources wherein the high frequency generator forms, together with at least one coupling capacitor, a single resonant circuit. This high frequency generator includes a phase-locked loop (PLL) control circuit. The impedance matching is done via RF frequency and/or phase control by the PLL controller, the RF frequency being adjustable in a range of 0.5 MHz to 30 MHz.

In the case of a system with a single resonant circuit, the plasma load is part of the resonant circuit. The circuit tuning depends on the plasma load impedance. In turn, the plasma impedance is dependent on the circuit tuning, since the plasma is created and maintained by the RF current of the circuit. As a result, the plasma parameters are changed after any change of the RF current amplitude due to the circuit tuning. This interdependency may lead to plasma instabilities, such as oscillations or even plasma extinction.

In particular application of RF plasma generator to ion thruster used in spacecraft propulsion, it is necessary to operate at the lowest possible pressure, close to boundary of plasma extinction with low margin. In this case, even slight disturbance can unbalance the system and lead to plasma extinction.

Thus, a method and device for RF plasma generation is required which enables tuning while maintaining the system in plasma ON conditions in response to changes in operational conditions.

SUMMARY OF THE INVENTION

Therefore one object of the invention is to provide a radio-frequency plasma generating system comprising a radio-frequency generator and a plasma source, the radio-frequency generator being inductively or capacitively coupled to the plasma source through a resonant electric circuit, the radio-frequency generator having an input to receive direct current power from a direct current power supply and an output for providing radio-frequency power at a frequency f to the plasma source.

According to the invention, the radio-frequency plasma generating system comprises means for measuring an efficiency of conversion E of direct-current power to active radio-frequency power absorbed by the plasma, and means for adjusting the frequency f as a function of the measured efficiency of conversion E so as to maintain the efficiency of conversion E in a predetermined range within a RF plasma operational range.

Another aspect of the invention is to provide a radio-frequency generator for plasma source, the radio-frequency generator being adapted for being inductively or capacitively coupled to a plasma source through a resonant electric circuit, the radio-frequency generator being adapted to receive direct current power from a direct current power supply and for generating radio-frequency power at a frequency f, the radio-frequency power comprising a reactive radio-frequency power oscillating in the resonant electric circuit and an active radio-frequency power absorbed by the plasma.

According to the invention, the radio-frequency generator comprises means for measuring an efficiency of conversion E of direct-current power to active radio-frequency power, when the radio-frequency generator is coupled to the plasma source including the plasma, without measuring phase mismatch between the radio-frequency voltage and current, and means for adjusting the frequency f as a function of the measured efficiency of conversion E so as to maintain the efficiency of conversion E in a predetermined range within a RF plasma operational range.

The invention provides automatic tuning of the RF generator frequency in response to change of the plasma source parameters. The RF generator is more compact than previous RF generators using matching devices and/or PLL devices. The RF generator provides a robust operating point with respect to variations in plasma operating conditions, such as temperature, gas pressure and/or gas flow rate.

According to a particular aspect of the invention, the means for adjusting the frequency f are configured to maintain the efficiency of conversion at a predetermined value.

According to an aspect of the invention, the RF plasma generating system comprises means for adjusting DC voltage of the direct current power so as to adjust the active radio-frequency power.

According to another particular aspect, the means for measuring an efficiency of conversion comprise a device for measuring direct current power at the input of the radio-frequency generator, a device for measuring active radio-frequency power and a control unit adapted for deducing the efficiency of conversion E from a ratio of the active radio-frequency power absorbed by the plasma to the direct current power measured.

According to another particular aspect, the device for measuring direct current power comprises a device for measuring DC current and a multiplier adapted for multiplying the measured DC current by DC voltage of the direct current power supply.

Advantageously, the device for measuring active radio-frequency power comprises a device for measuring the instantaneous radio-frequency current at input of plasma source and another multiplier adapted for multiplying the measured instantaneous radio-frequency current by the instantaneous radio-frequency voltage and a low-pass filter to extract from the instantaneous RF power a mean value of the active radio-frequency power absorbed by the plasma.

According to an embodiment, the means for adjusting the frequency f comprise a power transistor, the control unit comprising a variable frequency oscillator, the gate of the power transistor being electrically connected to an output of the variable frequency oscillator, the control unit being configured to change the oscillator frequency so as to adjust the opening and closing frequency and/or duty cycle of the power transistor and so as to generate oscillations in the resonant circuit at the oscillator frequency.

According to a particular embodiment, the control unit comprises another output connected to the direct current power supply, the control unit generating another variable driving voltage suitable for adjusting the direct current voltage of the direct current power supply at the input of the radio-frequency generator.

Advantageously, the control unit comprises a digitally programmable feedback system.

Generally, the active radio-frequency power is comprised between 1 W and 5000 W.

According to an aspect of the invention, the plasma source comprises a gaseous medium formed from a gas selected from one or more among the following noble gases: helium, neon, argon, krypton, xenon and/or from a solid material selected from one or more among the following materials: diode ($I_2$), bismuth (Bi), cesium (Ce), cadmium (Cd), tin (Sn), indium (In), gallium (Ga), germanium (Ge), lithium (Li), mercury (Hg), adamantane, ferrocene, arsenic, polyvinyl chloride, polyimide or polytetrafluoroethylene.

According to a particular embodiment, the resonant electric circuit comprises a capacitance and an inductive coil arranged for inductive coupling to the plasma source.

According to another particular embodiment, the resonant electric circuit comprises an inductive coil and electrodes of the plasma source arranged for capacitive coupling to the plasma source.

A further object of the invention is to provide a thruster comprising a radio-frequency plasma generating system according to any of the embodiments disclosed, the thruster being an ion thruster or plasma thruster, a Hall effect thruster, a gridded ion thruster, a free plasma expansion thruster with magnetic nozzle, a free plasma expansion thruster without magnetic nozzle or an electromagnetic plasma thruster.

Preferably, the means for adjusting the frequency f are configured to maximize the efficiency of conversion E within the plasma operational range.

A further object of the invention is to provide a method for adjusting a radio-frequency plasma generating system according to any of the embodiments disclosed, the method comprising the following steps:

receiving direct current power at the input of the radio-frequency generator so as to generate radio-frequency power at a frequency f at the output of the radio-frequency generator, the radio-frequency power comprising a reactive radio-frequency power oscillating in the resonant electric circuit and an active radio-frequency power absorbed by the plasma;

measuring an efficiency of conversion E of direct-current power to active radio-frequency power absorbed by the plasma, and adjusting the frequency f as a function of the measured efficiency of conversion E so as to maintain the efficiency of conversion E in a predetermined range within a radio-frequency plasma operational range.

BRIEF DESCRIPTION OF THE DRAWINGS

The following description with reference to the accompanying drawings will make it clear what the invention consists of and how it can be achieved. The invention is not limited to the embodiments illustrated in the drawings. Accordingly, it should be understood that where features mentioned in the claims are followed by reference signs, such signs are included solely for the purpose of enhancing the intelligibility of the claims and are in no way limiting on the scope of the claims.

In the accompanying drawings.

DESCRIPTION OF THE PREFERRED EMBODIMENTS

Device

Figure 1:
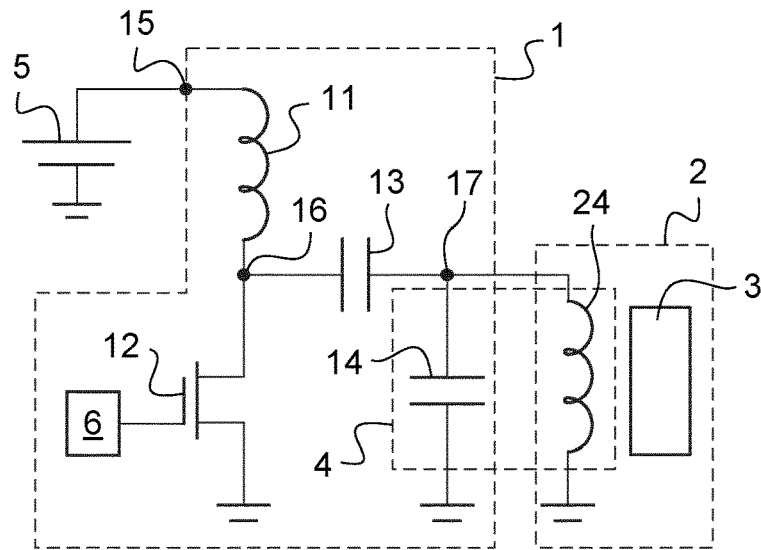
FIG. 1 represents schematically an RF plasma generating system comprising a radio-frequency generator inductively coupled to a plasma source.

FIG. 1 represents an RF plasma generating system comprising a radio-frequency generator 1 coupled to a plasma source 2 according to the invention. A DC power supply 5 is electrically connected to the input 15 of the radio-frequency generator 1. The radio-frequency generator 1 comprises an inductance 11, also named choke, a control unit 6, a power transistor 12, a series capacitance 13 and a resonance capacitance 14. In the example of FIG. 1, the plasma source 2 comprises an inductive coil 24 adapted for coupling RF energy into the plasma 3. The resonance capacitance 14 and the inductive coil 24 form a resonant circuit 4. The inductive coil 24, also called antenna, is generally wounded around the plasma chamber.

The DC power supply 5 generates DC energy at a given DC voltage, noted $U_{DC}$, at input point 15 of RF generator, and a DC current, noted $I_{DC}$. The inductance 11 prevents passing of RF current through the DC power supply 5. The control unit 6 drives the power transistor 12 so that it is opened at zero voltage and closed at zero current.

The values of the series capacitance 13, resonance capacitance 14 and inductive coil 24 can be defined by the following.

The inductive coil 24 inductance, L, is usually defined by the design of the plasma source, so it is given. For example, the inductive coil 24 inductance, L, is comprised between 1 and 10 microhenry.

The resonance capacitance 14 value, noted $C_R$, is determined from the known inductance of the coil 24 coupled to the plasma and desired frequency f using the resonant condition:

$$f = \frac{1}{2\pi\sqrt{LC_R}}$$

The above resonant condition provides a first approximation. Indeed, the capacitance of the power transistor 12 and the series capacitance 13 are also part of the resonant circuit. However, the series capacitance is undefined yet at this step. Thus, the resonant condition is generally refined using a successive approximation method.

Generally, the operation frequency is in the range from 1 to 30 MHz. The above resonance condition equation gives a rough, initial, frequency setting. As explained below, according to the present disclosure, the operation frequency is automatically retuned next, so the final value of operation frequency is generally not the same as initial.

The series capacitance 13 value, C, is essential for the system operation at maximum efficiency. For calculation of C, the following equation is used:

$$U_{ia}^2 \omega C_T \left(\frac{C}{C+C_T}\right)^2 = 8P \qquad (1)$$

where $U_{ia}$ is the voltage applied on the inductive coil 24, P is the active RF power absorbed by the plasma, $\omega = 2\pi f$ is the operation frequency, $$C_T = \frac{C_{T1}}{\sqrt{U_{DC}}}$$

represents the voltage-dependent power transistor capacitance and $C_{T1}$ represents the power transistor capacitance at the drain voltage of 1 Volt. The equation (1) can be solved numerically in order to find the optimal value of C for predefined values of $U_{ia}$ and $U_{DC}$.

Depending on desired values for $U_{ia}$ and P, the value of C can vary in a wide range. In all cases the equation (1) remains valid, but its usage is complicated. In at least the following two limit cases, the calculation can be simplified.

In the limit case where $C \ll C_T$, equation (1) can be simplified, and one can find the value of the series capacitance C and the DC voltage $U_{DC}$ directly.

$$C = \sqrt{\frac{8PC_T}{U_{ia}^2 \omega}}$$

$$U_{DC} = \frac{U_{ia}}{3.8} \frac{C}{C+C_T}$$

In the opposite limit case where $C \gg C_T$, the capacitance C vanishes from equation (1). This means that specific capacitance value does not play a role. The main condition is that $C_T$ is rather high, generally higher than 10. $C_R$. We derive from equation (1):

$$C_T = \frac{8P}{U_{ia}^2 \omega}$$

Thus, the DC voltage $U_{DC}$ is selected so as to provide the required power P.

Figure 2:
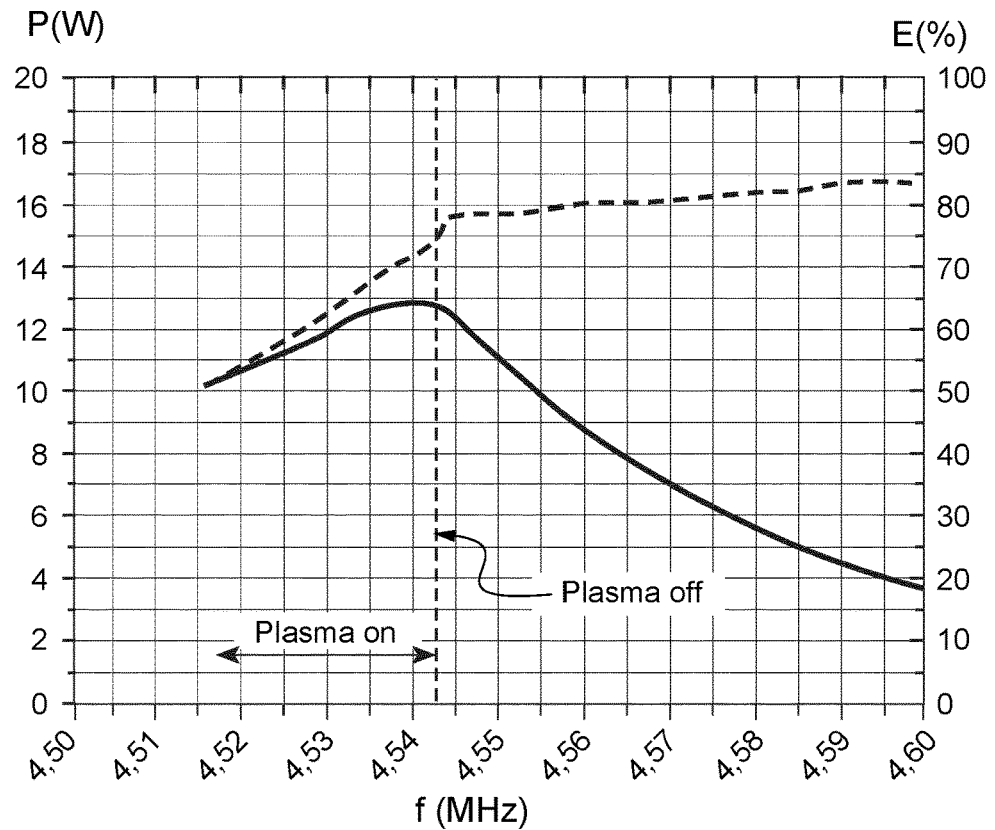
FIG. 2 represents a curve of active radio-frequency power (with constant input DC voltage $U_{DC}$) as a function of RF frequency (black line), a curve of RF efficiency of conversion as a function of RF frequency (dashed line) and the plasma operational range (bounded by vertical dashed line)

FIG. 2 illustrates an experimental measurement of the resonance of plasma-coupled radio-frequency generator according to the present disclosure for a plasma source operating with Xenon at pressure about 0.1 Pa. The frequency scanning starts from the initial frequency 4,515 MHz with the plasma ignited. Next, the frequency is increased with spontaneous plasma extinction at the frequency marked with vertical dashed line. The solid curve represents the RF power P at the output of the RF generator as a function of RF frequency f around the resonance frequency. The dashed curve represents the efficiency of conversion E of direct-current power to active radio-frequency power as a function of RF frequency f. In this example, the RF power curve, P, presents a maximum of about 13 W at the resonance frequency of about 4.54 MHz. The main peculiarity of the curve of efficiency of conversion E is its asymmetry with respect to the maximum of the RF power curve. Indeed, at a frequency of 4,543 MHz the plasma extinction appears. The plasma extinction excludes the possibility to use frequency scanning over the resonant curve in order to find optimal conditions. An aspect of the present invention derives from the observation that the maximum possible efficiency is reached near the extinction threshold. Thus, a desirable operating point is selected as close as possible to the extinction frequency. However, the resonance frequency, and consequently the plasma extinction frequency, may drift due to change in temperature, plasma density and/or gas flow. In other words, the curves, P and E, represented on FIG. 2, may be shifted left or right in response to the parameter change. If we stay at the same operation frequency, the optimal point will run away. According to the present disclosure, the operation frequency is adjusted so as to follow the resonant curve shift and so as to be always at the optimal frequency corresponding to the maximum possible efficiency below the plasma extinction threshold.

According to the present disclosure, no phase locked loop is required for measuring the phase mismatch between RF voltage and current. The present disclosure only measures one parameter which is the efficiency of conversion E of DC power to active radio-frequency power. The measured value of efficiency of conversion E is used as an input parameter for the operation frequency adjustment to the optimal value. A control unit is used to maintain the operation frequency f at the optimal operating point, by rapid adjustment of the frequency in response to external variations. More precisely, the control unit 6 contains a controlled oscillator (or frequency synthesizer), the output of which is connected to the transistor's gate. Thus, changing the oscillator frequency enables to adjust the transistor opening and closing frequency that creates oscillations in the main resonant circuit with the same frequency.

On FIG. 2, it is observed experimentally that the efficiency E grows monotonically when the RF frequency increases in the range where the plasma is ON. Moreover, the value of the efficiency for the optimal operation point is constant for specific gas in a wide range of RF powers. The target efficiency of conversion E may be calibrated for a given plasma source and for determined operating conditions including gas type, pressure, temperature, gas flow rate.

For example, as illustrated on FIG. 2, the target or optimum efficiency for xenon plasma is 72.5% at a frequency of 4,541 MHz. The optimum efficiency value can be calibrated in a table depending on the gas composition used for generating the plasma.

Figure 3:
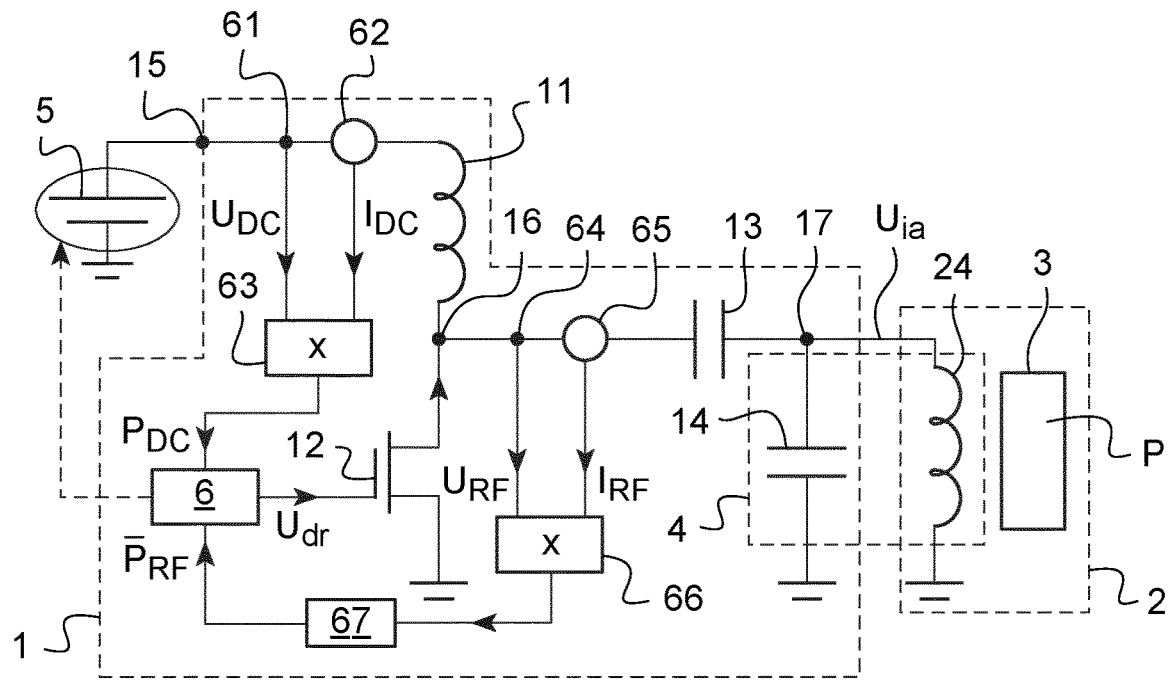
FIG. 3 represents an exemplary embodiment of an RF plasma generating system comprising a radio-frequency generator inductively coupled to a plasma source according to the invention.

FIG. 3 represents an example of an RF plasma generating system comprising a RF generator according to the present disclosure.

Similarly to FIG. 1, a DC power supply is electrically connected at the input 15 of the RF generator 1 and a plasma source 2 is electrically connected at the output 17 of the RF generator.

The DC voltage $U_{DC}$ is taken at point 61 at the input of the RF generator. The RF generator 1 comprises a DC current meter 62 to measure DC current $I_{DC}$ at the input point 15. The DC current meter 62 comprises for example a current transducer converting the DC current to a proportional voltage. A multiplier 63 multiplies the DC voltage $U_{DC}$ by the measured voltage proportional to the DC current to provide a measurement of DC power, noted $P_{DC}$.

An active RF power meter comprises a multiplier 66 and a low-pass filter 67. The instantaneous RF voltage $U_{RF}$ and the instantaneous RF current $I_{RF}$ are taken at the output point 64 of the RF stage. The active RF power meter comprises a RF current meter 65 to measure RF current $I_{RF}$. The RF current meter 65 comprises for example a current transducer converting the RF current to a proportional voltage. The multiplier 66 receives two waves, one wave corresponding to the instantaneous RF voltage $U_{RF}$ and another wave corresponding to the instantaneous RF current $I_{RF}$. At each time instant, the multiplier 66 multiplies the value of instantaneous RF voltage $U_{RF}$ by the value of the instantaneous RF current $I_{RF}$ to provide an instantaneous measurement of RF power. Thus, the multiplier 66 does not multiply amplitudes or mean values of the RF voltage and RF current, but just the RF waveforms. The multiplier 66 is a fast analog multiplier having a frequency bandwidth much higher than the operation frequency. The multiplier 66 outputs also a wave. More precisely, the product of the two waves is an oscillating alternative (generally non-sinusoidal) voltage which is proportional to the full RF power. As explained above, the full RF power comprises two parts: a reactive radio-frequency power part, which is oscillating and is zero in average over an oscillation period, and an active radio-frequency power absorbed by the plasma. The low-pass filter 67, with a cut-off frequency much lower than the operation frequency, averages the output of the multiplier 66 to obtain the active RF power. Thus, the active RF power is the result of averaging the multiplier output over an oscillation period (or multiple periods). The averaging is performed here by the low pass filter which accepts RF wave and outputs the mean value. The control unit 6 receives on one side the measured DC power, and, on the other side, the measured average RF power or active RF power. The control unit 6 calculates the efficiency E of DC to RF power by dividing the active RF power by the DC power. Depending on error value, that is the difference between the calculated efficiency and the target efficiency, the control unit 6 calculates the new frequency value to compensate the error. The control unit 6 generates a pulsed wave driving voltage as a function of the calculated frequency, which is applied to the gate of the power transistor 12 that causes oscillations in the main resonant circuit 4 with the same frequency. Thus, the control unit 6 enables adjustment of the frequency f so that the measured efficiency E tends towards the predetermined optimum value of efficiency.

Advantageously, the control unit 6 comprises a digitally programmable feedback system. The RF generator is operable over a broad range of frequency for example from 0.5 MHz to 30 MHz. However, the range of variation of resonant frequency by left or right shift of the resonant curve, due to operation condition variation, is narrow. For example, for a device having an efficiency of conversion as illustrated on FIG. 2, the operational frequency is adjusted within a range from 4.5 MHz to 4.6 MHz, with a resolution lower than or equal to 1 kHz.

Moreover, the RF power control can be performed by adjusting the DC voltage of the DC power supply 5 or by changing the duty cycle of the power transistor 12. The duty cycle is for example changed by changing the pulse width of the pulse wave generated by the oscillator of the control unit 6.

The output power of the RF generator is for example comprised between 1 W and 10 kW.

The present invention finds application in inductively-coupled plasma sources as well as capacitively-coupled plasma sources.

Figure 4:
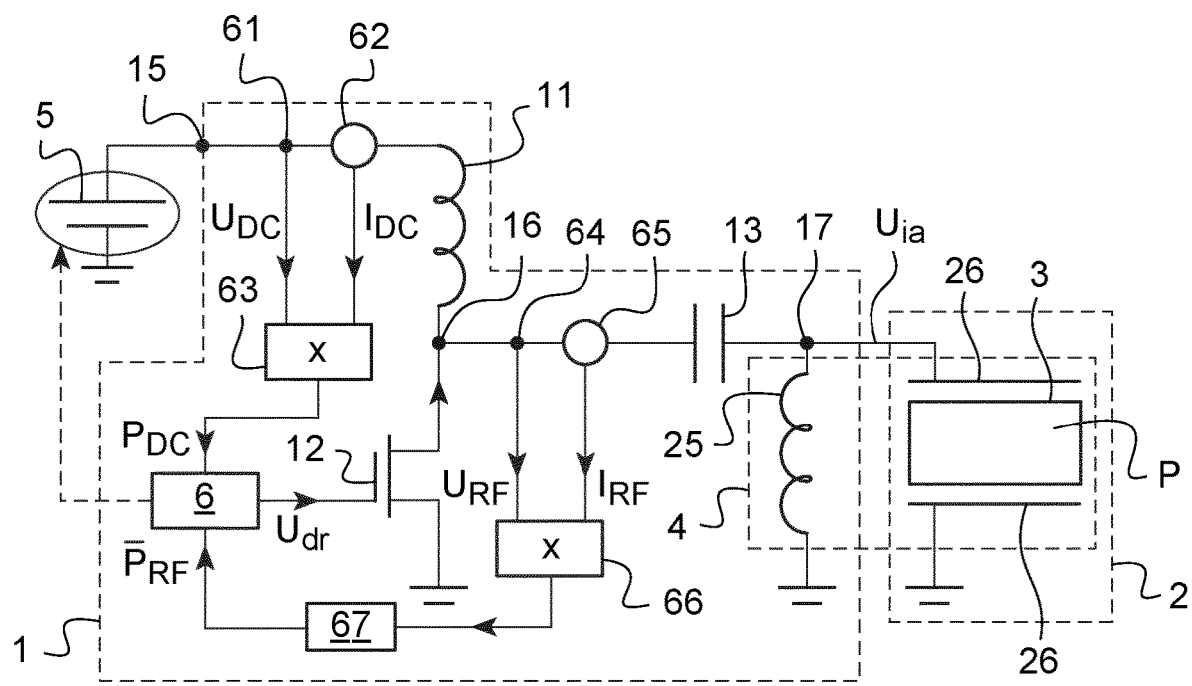
FIG. 4 represents an exemplary embodiment of an RF plasma generating system comprising a radio-frequency generator capacitively coupled to a plasma source according to the invention.
Figure 5:
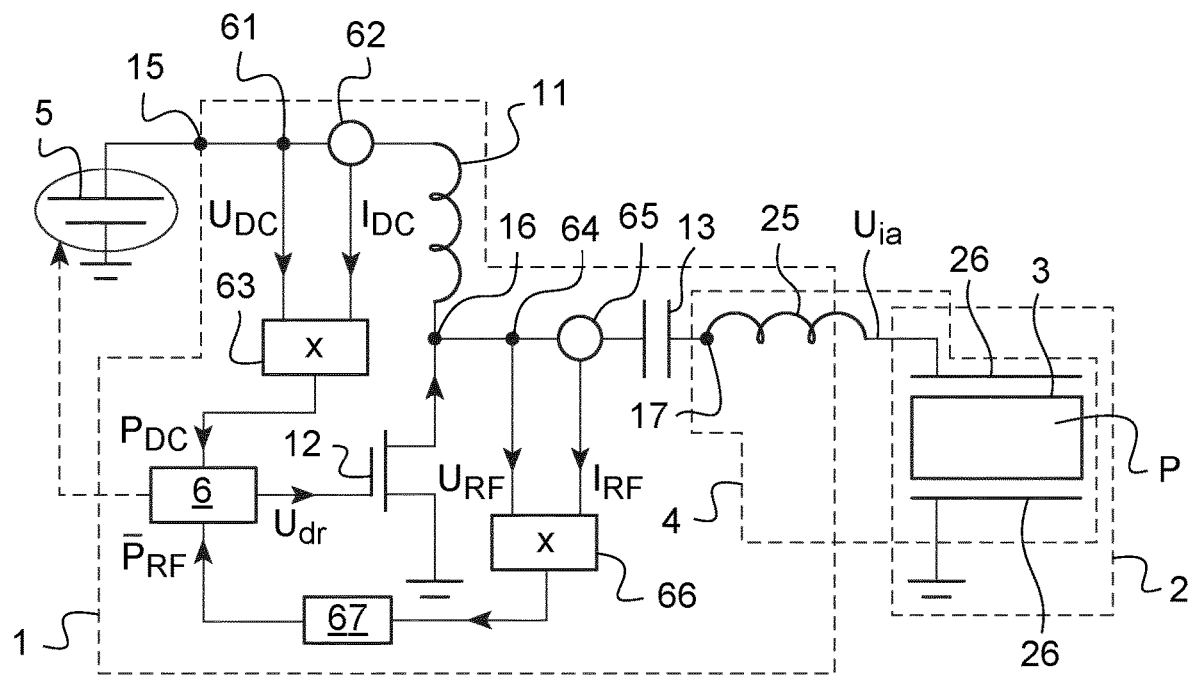
FIG. 5 represents another exemplary embodiment of an RF plasma generating system comprising a radio-frequency generator capacitively coupled to a plasma source according to the invention.

FIGS. 4 and 5 show embodiments according to the invention of a RF generator for a plasma source wherein the RF generator is capacitively coupled to the plasma source. The RF generator itself comprises the same elements as disclosed in relation with FIG. 3 and operates in a similar way as described above.

In FIG. 4, compared with FIG. 3, in the resonant circuit 4, the capacitance and inductance are swapped. More precisely, in FIG. 4, the plasma source 2 is capacitively coupled using parallel plate electrodes 26, the plasma 3 being placed in between the electrodes 26. The electrodes 26 are arranged electrically in parallel with an inductance 25.

FIG. 5 shows another example of an RF plasma generating system comprising a RF generator which is capacitively coupled to the plasma source. The plasma source 2 is capacitively coupled using parallel plate electrodes 26, the plasma 3 being placed in between the electrodes 26. The electrodes 26 are arranged electrically in series with an inductance 25 placed at the output 17 of the RF generator.

The plasma source itself may be used for generating ions and/or electrons for example in plasma or ion thruster used in spacecraft propulsion. In particular, the thruster can be any one of the following type of ion thruster or plasma thruster: a Hall effect thruster, a gridded ion thruster, a free plasma expansion thruster with magnetic nozzle, a free plasma expansion thruster without magnetic nozzle or an electromagnetic plasma thruster.

The plasma source may also be used for surface treatment, such as deposition and/or etching.

Process

First, the inductance of the inductive coil 24 coupling RF energy into the plasma is determined, since it is usually fixed.

Then, the desired resonance frequency is determined within a range from 0.5 MHz to 30 MHz.

Thus, the value of the resonance capacitance, $C_R$, is determined from the resonance condition.

Then, the DC power to RF power conversion efficiency is measured as a function of RF frequency, in a pre-determined range. The frequency scan is performed with ignited plasma, increasing the frequency from the lowest value. During the frequency scan the plasma extinction threshold frequency is noted.

The optimum value of conversion efficiency within the plasma ON range is determined, below the plasma extinction threshold frequency. The optimum value of conversion efficiency or target efficiency depends on the gas composition of the plasma.

Then, the DC voltage is adjusted in order to obtain the predefined value of active RF power while always keeping the efficiency E at the determined optimum value of conversion efficiency by means of adjusting the operation frequency f. A feedback algorithm is implemented in the control unit 6 which adjusts the driving voltage frequency and/or duty cycle applied to the power transistor 12 and in turn adjusts the operation frequency f so as to maintain the conversion efficiency to the optimum predetermined value, depending on the gas composition of the plasma.

The invention claimed is:

1. A radio-frequency plasma generating system comprising a radio-frequency generator (1) and a plasma source (2), the radio-frequency generator (1) being inductively or capacitively coupled to the plasma source through a resonant electric circuit (4), the radio-frequency generator (1) having an input (15) to receive direct current power from a direct current power supply (5) and an output (17) for providing radio-frequency power at a frequency f to the plasma source (2), wherein the radio-frequency plasma generating system comprises:
means for measuring an efficiency of conversion E of direct-current power to active radio-frequency power absorbed by a plasma, and
means for adjusting the frequency f as a function of the measured efficiency of conversion E so as to maintain the efficiency of conversion E in a predetermined range within a radio-frequency plasma operational range.

2. The radio-frequency plasma generating system according to claim 1, wherein the means for adjusting the frequency f are configured to maintain the efficiency of conversion at a predetermined value.

3. The radio-frequency plasma generating system according to claim 1, comprising means for adjusting DC voltage of the direct current power so as to adjust the active radio-frequency power.

4. The radio-frequency plasma generating system according to claim 1, wherein the means for measuring an efficiency of conversion comprise a device for measuring direct current power at the input (15) of the radio-frequency generator (1), a device for measuring active radio-frequency power and a control unit (6) adapted for deducing the efficiency of conversion E from a ratio of the active radio-frequency power absorbed by the plasma to the direct current power measured.

5. The radio-frequency plasma generating system according to claim 4, wherein the device for measuring direct current power comprises a device for measuring DC current (62) and a multiplier (63) adapted for multiplying the measured DC current by DC voltage of the direct current power supply.

6. The radio-frequency plasma generating system according to claim 4, wherein the device for measuring the active radio-frequency power comprises a device measuring the instantaneous radio-frequency current and another multiplier adapted for multiplying the measured instantaneous radio-frequency current by the instantaneous radio-frequency voltage and a low-pass filter (67) to extract from the instantaneous radio-frequency power a mean value of the active radio-frequency power absorbed by the plasma.

7. The radio-frequency plasma generating system according to claim 4, wherein the means for adjusting the frequency f comprise a power transistor (12), the control unit (6) comprising a variable frequency oscillator, the gate of the power transistor (12) being electrically connected to an output of the variable frequency oscillator, the control unit (6) being configured to change the oscillator frequency so as to adjust the opening and closing frequency and/or duty cycle of the power transistor (12) and so as to generate oscillations in the resonant circuit (4) at the oscillator frequency.

8. The radio-frequency plasma generating system according to claim 4, wherein the control unit (6) comprises another output connected to the direct current power supply (5), the control unit (6) generating another variable driving voltage suitable for adjusting the direct current voltage of the direct current power supply (5) at the input (15) of the radio-frequency generator.

9. The radio-frequency plasma generating system according to claim 4, wherein the control unit (6) comprises a digitally programmable feedback system.

10. The radio-frequency plasma generating system according to claim 1, wherein the active radio-frequency power is comprised between 1 W and 5000 W.

11. The radio-frequency plasma generating system according to claim 1, wherein the plasma source comprises a gaseous medium formed from a gas selected from one or more among the following noble gases: helium, neon, argon, krypton, xenon and/or from a solid material selected from one or more among the following materials: diode ($I_2$), bismuth (Bi), cesium (Ce), cadmium (Cd), tin (Sn), indium (In), gallium (Ga), germanium (Ge), lithium (Li), mercury (Hg), adamantane, ferrocene, arsenic, polyvinyl chloride, polyimide or polytetrafluoroethylene.

12. The radio-frequency plasma generating system according to claim 1, wherein the resonant electric circuit (4) comprises a capacitance (14) and an inductive coil (24) arranged for inductive coupling to the plasma source.

13. The radio-frequency plasma generating system according to claim 1, wherein the resonant electric circuit (4) comprises an inductive coil (25) and electrodes (26) of the plasma source arranged for capacitive coupling to the plasma source.

14. A thruster comprising a radio-frequency plasma generating system according to claim 1, the thruster being an ion thruster or plasma thruster, a Hall effect thruster, a gridded ion thruster, a free plasma expansion thruster with magnetic nozzle, a free plasma expansion thruster without magnetic nozzle or an electromagnetic plasma thruster.

15. A method for adjusting a radio-frequency plasma generating system according to claim 1, the method comprising the following steps:
receiving direct current power at the input (15) of the radio-frequency generator (1) so as to generate radio-frequency power at a frequency f at the output (17) of the radio-frequency generator (1),
measuring an efficiency of conversion E of direct-current power to active radio-frequency power absorbed by a plasma, and
adjusting the frequency f as a function of the measured efficiency of conversion E so as to maintain the efficiency of conversion E in a predetermined range within a radio-frequency plasma operational range.

16. The radio-frequency plasma generating system according to claim 2, comprising means for adjusting DC voltage of the direct current power so as to adjust the active radio-frequency power.

17. The radio-frequency plasma generating system according to claim 2, wherein the means for measuring an efficiency of conversion comprise a device for measuring direct current power at the input (15) of the radio-frequency generator (1), a device for measuring active radio-frequency power and a control unit (6) adapted for deducing the efficiency of conversion E from a ratio of the active radio-frequency power absorbed by the plasma to the direct current power measured.

18. The radio-frequency plasma generating system according to claim 3, wherein the means for measuring an efficiency of conversion comprise a device for measuring direct current power at the input (15) of the radio-frequency generator (1), a device for measuring active radio-frequency power and a control unit (6) adapted for deducing the efficiency of conversion E from a ratio of the active radio-frequency power absorbed by the plasma to the direct current power measured.

19. The radio-frequency plasma generating system according to claim 5, wherein the plasma source comprises a gaseous medium formed from a gas selected from one or more among the following noble gases: helium, neon, argon, krypton, xenon and/or from a solid material selected from one or more among the following materials: diode ($I_2$), bismuth (Bi), cesium (Ce), cadmium (Cd), tin (Sn), indium (In), gallium (Ga), germanium (Ge), lithium (Li), mercury (Hg), adamantane, ferrocene, arsenic, polyvinyl chloride, polyimide or polytetrafluoroethylene.

20. The radio-frequency plasma generating system according to claim 6, wherein the plasma source comprises a gaseous medium formed from a gas selected from one or more among the following noble gases: helium, neon, argon, krypton, xenon and/or from a solid material selected from one or more among the following materials: diode ($I_2$), bismuth (Bi), cesium (Ce), cadmium (Cd), tin (Sn), indium (In), gallium (Ga), germanium (Ge), lithium (Li), mercury (Hg), adamantane, ferrocene, arsenic, polyvinyl chloride, polyimide or polytetrafluoroethylene.

* * * * *